United States Patent [19]
Yusa et al.

[11] Patent Number: 6,125,054
[45] Date of Patent: *Sep. 26, 2000

[54] ROM DATA READ PROTECT CIRCUIT

[75] Inventors: Terukazu Yusa; Michiaki Kuroiwa, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/276,752

[22] Filed: Mar. 26, 1999

[30] Foreign Application Priority Data

Nov. 10, 1998 [JP] Japan .................................. 10-318974

[51] Int. Cl.[7] .................................................... G11C 16/06
[52] U.S. Cl. ................. 365/185.04; 365/195; 365/189.07
[58] Field of Search ................................. 365/185.4, 195, 365/189.7

[56] References Cited

U.S. PATENT DOCUMENTS 5,768,208  6/1998  Bruwer et al. ........................... 365/228
5,883,831  3/1999  Lopez et al. ......................... 365/185.04
5,912,848  6/1999  Bothwell .................................. 365/195

FOREIGN PATENT DOCUMENTS 5-20204  1/1993  Japan .............................. G11C 16/06

*Primary Examiner*—Andrew Q. Tran
*Attorney, Agent, or Firm*—McDermott, Will & Emery

[57] ABSTRACT

A ROM data read protect circuit according to the present invention comprises a non-volatile memory that stores a data for allowing or inhibiting reading of the ROM data and a logic circuit for control for controlling allowing or inhibiting of an operation for reading of data in a ROM according to the data stored in the non-volatile memory. When "0" is written in a first storage area of the non-volatile memory reading of the ROM data is inhibited, and when "0" is written in a second storage area of the non-volatile memory reading of the ROM data is allowed. A data can be written anytime in the first storage area but data can not be deleted from the first storage, so that the read inhibit mode is always effected in the initial state. A data can be written in the second storage area only when specific setting is executed but can not be deleted from the second storage.

9 Claims, 8 Drawing Sheets

ROM DATA READ PROTECT CIRCUIT

FIELD OF THE INVENTION

The present invention relates to a circuit which protects against reading of data written in a read-only memory (described as ROM hereafter) incorporated in a microcomputer.

BACKGROUND OF THE INVENTION

Generally a microcomputer which incorporates a ROM therein has a mode for outputting data stored in the ROM (described as ROM data) for checking whether data such as a program has been correctly written in the ROM or not. When this mode is selected, as shown in FIG. 9, data corresponding to an address sent via an address bus from a central processing unit (described as CPU) 11 of the microcomputer is read from ROM 13, and the data is transferred via a data bus 14 to an output port 15, and is outputted to the outside.

FIG. 10 is a flow chart showing a sequence of operations for checking ROM data. When checking of ROM is started, the CPU 11 executes a program using a MOV instruction, and with this operation, the ROM data is outputted by byte to the output port 15 (step S1). The outputted ROM data is compared with an expected value for the data, and when the ROM data is coincident with the expected value it is determined that the data is correct (step S2). When comparison of all of the ROM data with the respective expected values is over (step S3), this checking operation ends. The program using the MOV instruction is generally stored in a random access memory (described as RAM hereinafter) not shown in the FIG. 9.

However, as a mode is prepared as described above for outputting ROM data to the outside, a third party can easily obtain information written in the ROM by using this mode, hence it is difficult to maintain security of the ROM data.

It is conceivable to protect the ROM data in order to prevent it from being read out from the outside, but in that case it is impossible to read out ROM data when testing the ROM or analysis of any faulty section, which is inconvenient for a user.

SUMMARY OF THE INVENTION

It is an object of the present invention to obtain a ROM data protect circuit which enables testing of ROM data and analysis of a faulty section and also can prevent reading of the ROM data by a third person.

With the present invention, the non-volatile memory having first and second storage areas is provided, the first storage area comprises at least one non-deletable and rewritable bit which stores a data for inhibiting the reading of the ROM data in the initial state, the second storage area comprises at least one not-deletable bit which is rewritable only when set in a specified state to store data for allowing reading of the ROM data according to a combination with the data stored in the first storage area, and a logic circuit for control is provided which allows or inhibits reading of the ROM data according to the contents stored in the non-volatile memory.

With the present invention, when reading of the ROM data is inhibited, the logic circuit for control inhibits an operation for reading only a portion of bits for each block of ROM data.

With the present invention, a second non-volatile memory is provided which stores data for setting a bit for inhibiting or enabling reading of data for each block of the ROM data, a decoder is provided for decoding the data, and the bit inhibiting or enabling reading of data for each block of the ROM data is selected.

With the present invention, the first storage area stores data used for comparison with a specified data stored at a specified address of the ROM, a comparing circuit is provided which compares the data stored in the first storage area with the specified data stored in the ROM, and outputs a signal allowing an operation for reading of data stored in the ROM only when the two data are identical.

With the present invention, a first storage area stores therein expected value data for all of the data stored in the ROM, the comparing circuit compares all of the expected value data stored in the first storage area with all of the ROM data, and when the data are not identical outputs a non-coincidence signal after comparison of all of the data is finished.

With the present invention, the comparing circuit compares specified data stored at a specified address of the ROM with the expected value data corresponding to the specified data of all of the expected value data stored in the first storage area, and compares all of the expected value data with all of the ROM data when the data are identical.

With the present invention, when the expected value data stored in the first storage area and all of the ROM data are not identical, a comparing circuit outputs addresses of the non-coincident blocks of the ROM data together with a non-coincidence signal.

Other objects and features of this invention will become apparent from the following description with reference to the accompanying drawings.

DESCRIPTION OF THE PREFERRED EMBODIMENT

Figure 1:
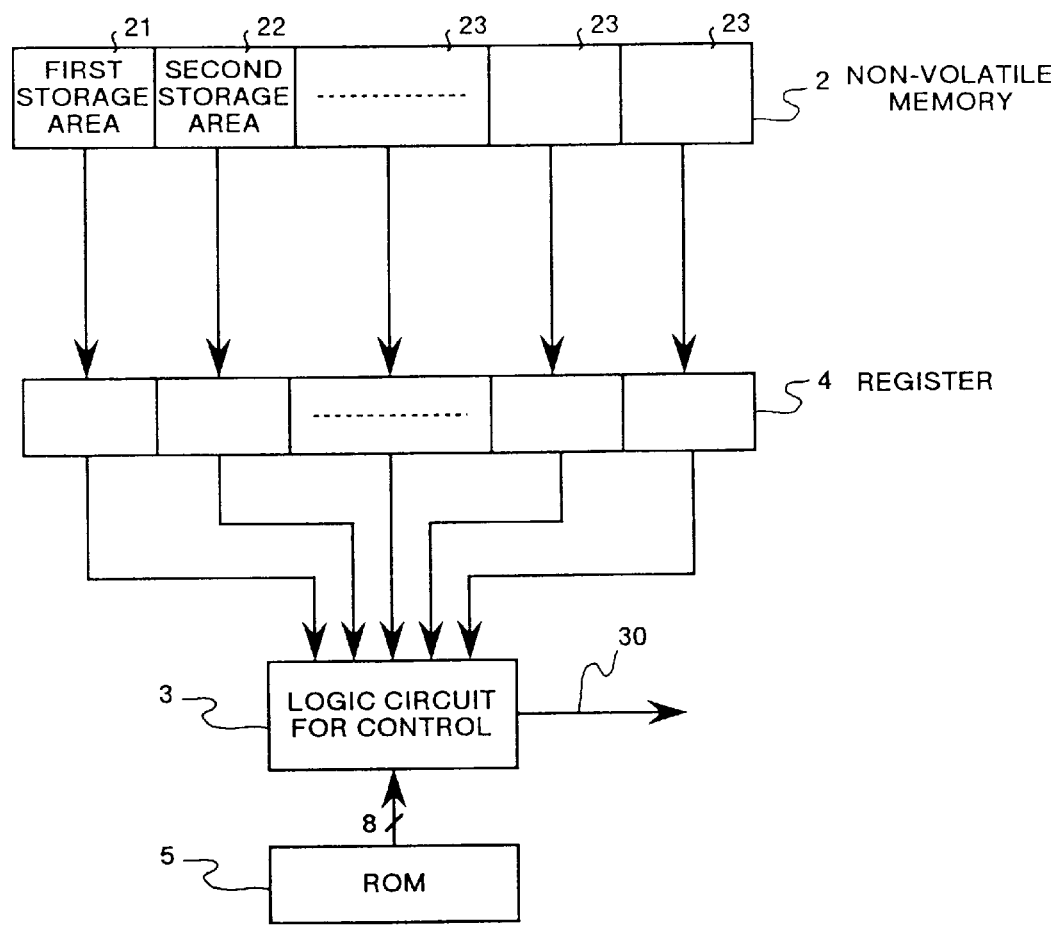
FIG. 1 is a block diagram showing essential sections of a read protect circuit according to Embodiment 1 of the present invention.

FIG. 1 is a block diagram showing essential sections of a read protect circuit according to Embodiment 1 of the present invention. This protect circuit is formed inside a chip constituting a microcomputer, and comprises a non-volatile memory 2 which stores data for enabling or inhibiting an operation for reading of data stored in a ROM, and a logic circuit for control 3 which controls enabling or inhibiting operation for reading of the data stored in the ROM according to the data stored in the non-volatile memory 2.

The reference numeral 4 in FIG. 1 indicates a register, and data stored in the non-volatile memory 2 is transferred to the register. The reference numeral 30 in FIG. 1 indicates output of ROM data stored in an internal ROM 5. For convenience of description, it is assumed herein that one block of ROM data comprises one byte, namely 8 bits, unless otherwise specified.

The non-volatile memory 2 comprises a plurality of storage areas including a first storage area 21 and a second storage area 22. The first storage area 21 comprises at least one bit though the example in the figure shows only one bit, and, for instance, when "0" is written in the first storage area 21 operation for reading of data stored in the ROM is inhibited. Data can be written in the first storage area 21 but the data written in the first storage area 21 can not be deleted and in the initial state always a read inhibit mode is effected. Therefore, when at first "1" is written in the first storage area 21, as the data can not be deleted, it becomes impossible to shift an operation mode to a read enabled mode.

The second storage area 22 comprises at least one bit though the example in the figure shows only one bit, and when, for instance, "0" is written in the second storage area 22 operation for reading of data stored in the ROM is enabled. Data can be written in the second storage area 22 only when a specific setting is executed but data in the second storage area 22 can never be deleted.

When the non-volatile memory 2 has, in addition to the first and second storage areas, another storage area 23, the storage area 23 may have the configuration where data write is enabled only when the same specific setting as that in the second storage area 22 is executed, data write is enabled, however the storage area 23 may have any other configuration.

Next description is made for actions in Embodiment 1. When operations in a microcomputer are started in the data enabled mode of the internal ROM 5, data stored in the non-volatile memory 2 is transferred to the register 4. The logic circuit for control 3 reads the data from the register 4, and controls allowing or inhibiting operation for reading of data stored in the ROM 5 according to the value of the data. For instance in the example described above, when both of the data stored in the first and second storage areas 21 and 22 are "0", an operation for reading of data stored in the ROM 5 is allowed, and the logic circuit for control 3 reads the data from the ROM 5. On the other hand, when reading of the ROM data is inhibited, the logic circuit for control 3 does not output data stored in the ROM 5.

With this Embodiment 1, the read protect circuit allows or inhibits reading of the ROM data according to data stored in the non-volatile memory 2, and further in order to read the data stored in the ROM, it is required to execute specific setting as well as to write, for instance, "0" in the second storage area 22, so that it becomes difficult for a third person to enter a mode enabling reading of the ROM data, and hence, it is possible to prevent illegal reading of the ROM data by a third person.

Figure 2:
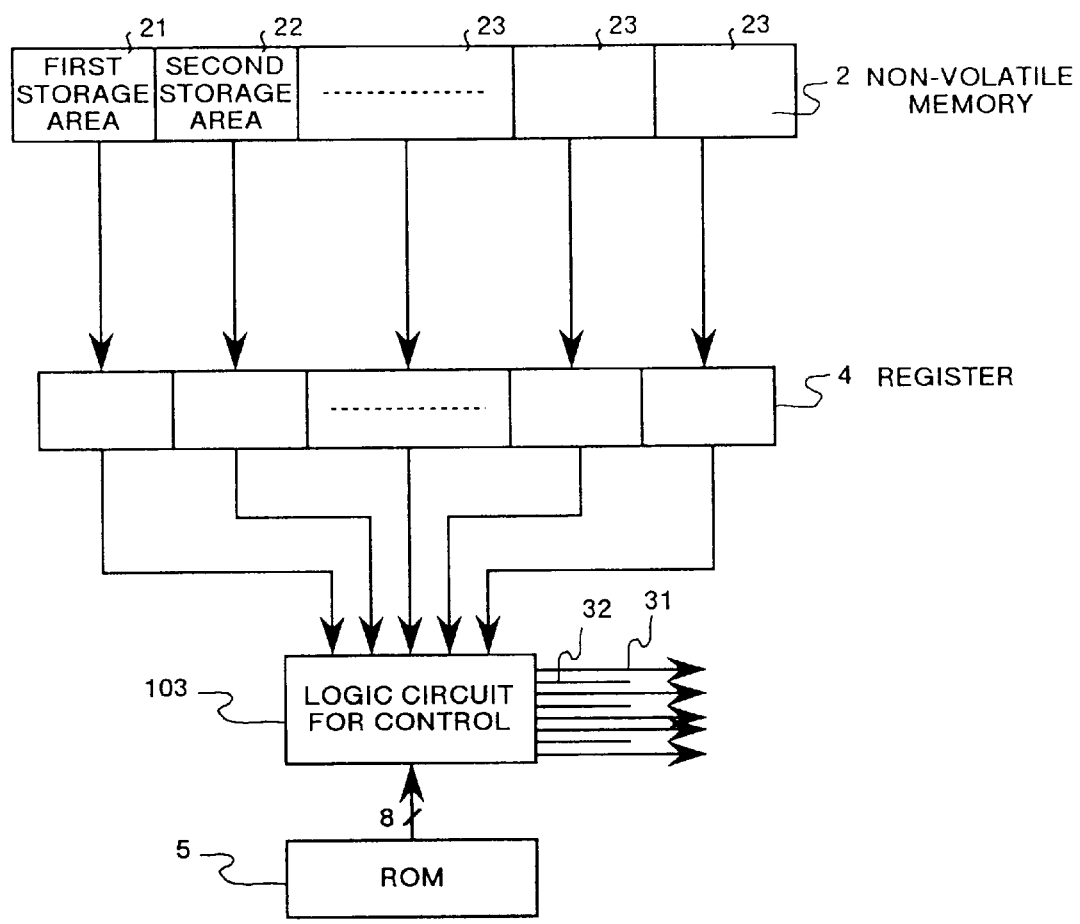
FIG. 2 is a block diagram showing essential sections of a read protect circuit according to Embodiment 2 of the present invention.

FIG. 2 is a block diagram showing essential sections of a read protect circuit according to Embodiment 2 of the present invention. Embodiment 2 is different from Embodiment 1 shown in FIG. 1 in that the logic circuit for control 103 inhibiting output of only a portion of bits in each block of the ROM data in the read inhibited mode is used in place of the logic circuit for control 3 inhibiting all of ROM data in the read inhibited mode. The same reference numerals are used for the same components as those in Embodiment 1 and description thereof is omitted herein.

In this embodiment, the logic circuit for control 103 reads the data from the ROM 5 in the ROM data read enabled mode and generally outputs all of the data, but when in read inhibited mode does not output at least one specified bit in each block of the ROM data and outputs other bits.

Data for which bit are to be outputted, or in other words, data for which bit are not to be outputted is previously decided in the logic circuit for control 103. FIG. 2 shows how data is outputted in the read inhibited mode, and the reference numerals 31 and 32 in this figure shows the state where ROM data is outputted and the state where ROM data is not outputted from the logic circuit for control 103 respectively.

With this Embodiment 2, the read protect circuit inhibits data read for only a portion of bits in each block of ROM data in the ROM data read inhibited mode, so that, if a third person tries to read out the ROM data, only a portion of the ROM data is read out. Therefore, even if the third person thinks that the ROM data is correctly being read out, in reality only a portion of the ROM data is outputted, so that it is possible to prevent illegal reading of ROM data by a third person.

Figure 3:
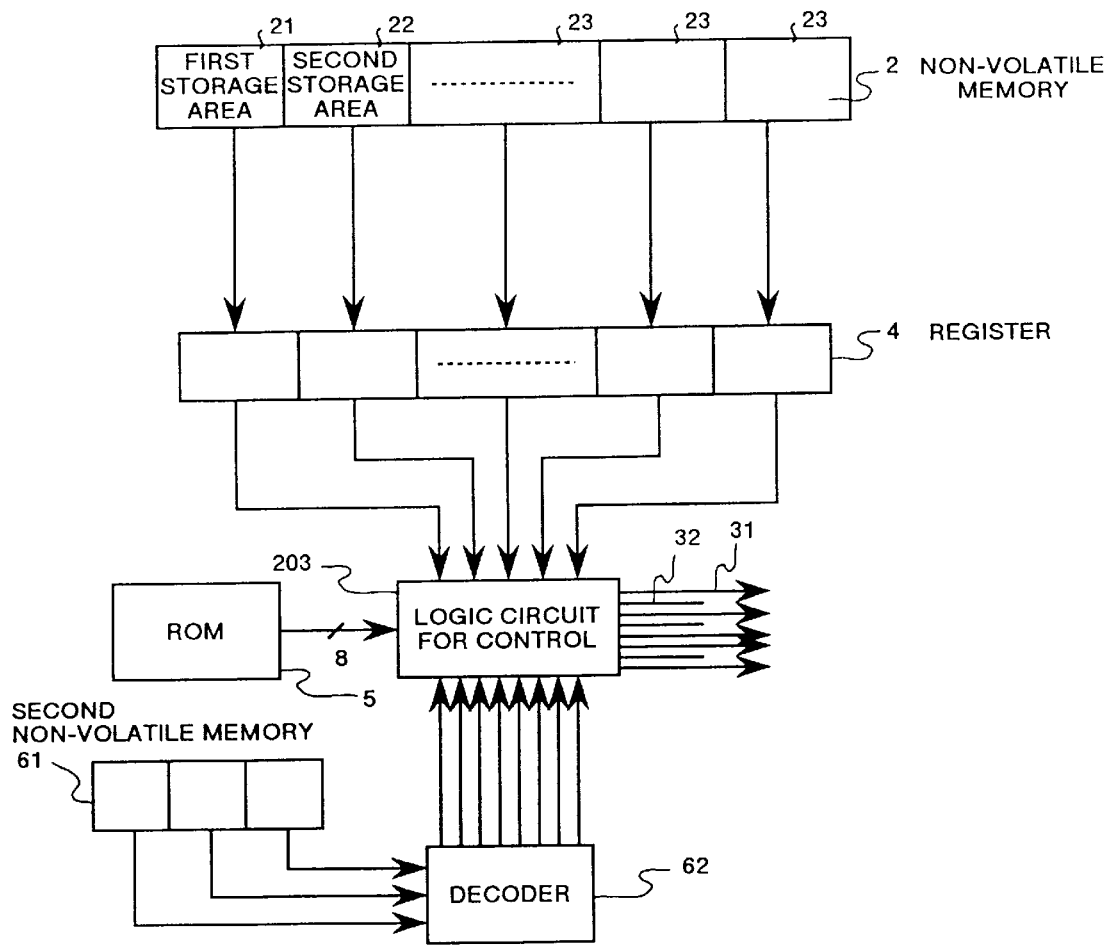
FIG. 3 is a block diagram showing essential sections of a read protect circuit according to Embodiment 3 of the present invention.

FIG. 3 is a block diagram showing essential sections of a read protect circuit according to Embodiment 3 of the present invention. This Embodiment 3 is a variant of Embodiment 2 shown in FIG. 2, and is different from Embodiment 2 in that, while in Embodiment 2 the specified bit outputted from a logic circuit for control 103 in the read inhibited mode are fixed one, in a Embodiment 3 a bit to be outputted in the read inhibited mode can freely be specified.

Therefore, in Embodiment 3, a logic circuit for control 203 is used in place of the logic circuit for control 103, and further there are provided a second non-volatile memory 61 for storing therein data for setting a bit or bits to be outputted in the read inhibited mode and a decoder 62 for decoding the data developing the data into signals for read-inhibited bits and read-enabled bit in each block of the ROM data. The same reference numerals are assigned to the same components as those in Embodiment 1 and description thereof is omitted herein.

In this Embodiment, the logic circuit for control 203 reads out data from the ROM 5 in the ROM data read enabled mode, and outputs all of the data. On the other hand, in the read inhibited mode, the logic circuit for control 203 reads out data from the ROM 5, selects bits in each block of ROM data and those to be outputted to the outside, and outputs only data for the bits to be outputted to the outside.

Data for which bits are to be outputted or data for which bits are not to be outputted can previously be decided according to data stored in the second non-volatile memory 61. FIG. 3 shows how data is outputted in the read inhibited mode, while the reference numerals 31 and 32 in this figure shows the state where ROM data is outputted, and the state where ROM data is not outputted from the logic circuit for control 203 in the read inhibited mode respectively.

With this Embodiment 3, any data can be stored in the second non-volatile memory 61, and the protect circuit decides bits to be read out or not to be read out in each block of ROM data, so that, even if a third person tries to read out data stored in the ROM, the correct data is not read out because a portion of the ROM data can not be read out, and a sequence for reading of the correct ROM data becomes more complicated, and hence it is possible to prevent illegal reading of ROM data by a third person.

Figure 4:
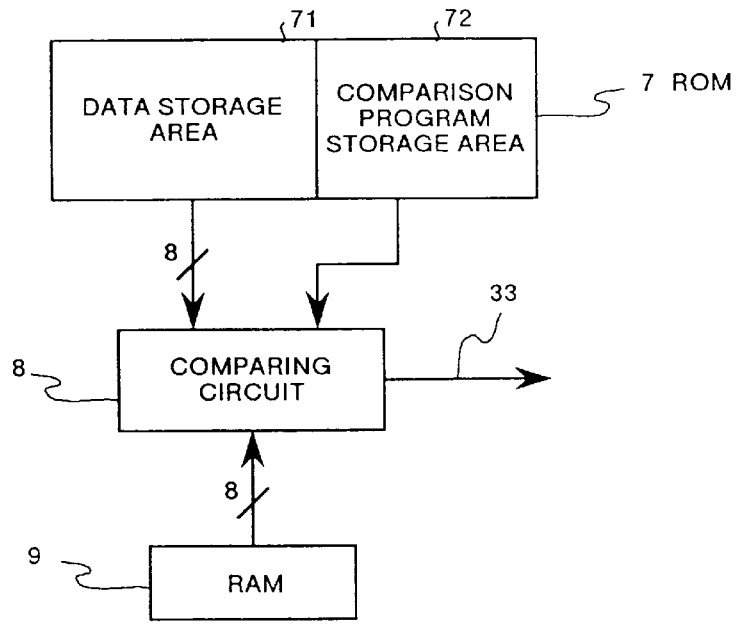
FIG. 4 is a block diagram showing essential sections of a read protect circuit according to Embodiment 4 of the present invention.

FIG. 4 is a block diagram showing essential sections of a read protect circuit according to Embodiment 4 of the present invention. This protect circuit is formed in a chip constituting a microcomputer, and comprises a RAM 9 as a first storage area for the data used for comparison with the data stored at specified addresses of an internal ROM 7 (described as specified data hereinafter) stored therein, and a comparing circuit 8 for comparing the data for comparison to the specified data.

The ROM 7 has a data storage area 71 and a comparison program storage area 72. The ROM data is stored in the data storage area 71, and a comparison program executed in the comparing circuit 8 is stored in the comparison program storage area 72 as a second storage area. It should be noted that, the comparison program itself is also included in data as an object for inhibition or permission of data read by the read protect circuit according to this embodiment.

The comparing circuit 8 outputs a signal for enabling an operation for reading all or a portion of the ROM data, namely a signal for enabling data read according to a result of comparison between the two types of data (the data for comparison and the specified data). The reference numeral 33 in FIG. 4 indicates the read enable signal.

Next, description is made for actions in Embodiment 4. Operations of the microcomputer are started in the mode enabling data read from the internal ROM 7, and then the data for comparison is written at a specified address of a ROM 9, the comparing circuit 8 reads out the specified data and the data for comparison from the ROM 7 and RAM 9 respectively according to a comparison program shored in the ROM 7, and compares the two types of data to each other. Only when the two types of data are coincident, a read enable signal is outputted, and the ROM data is outputted to the outside according to the read enable signal. When the two types of data are not coincident, namely when a person without knowing the contents of the ROM data inputs incorrect data for comparison, output of the ROM data is inhibited.

With this Embodiment 4, the read protect circuit enables data read only when the data for comparison inputted to the RAM 9 is coincident to the specified data in the ROM 7, but it is impossible for a person who does not know the data for comparison to input the correct data, and hence it is possible to prevent a third person not knowing contents of the ROM data from illegally reading out the ROM data.

Figure 5:
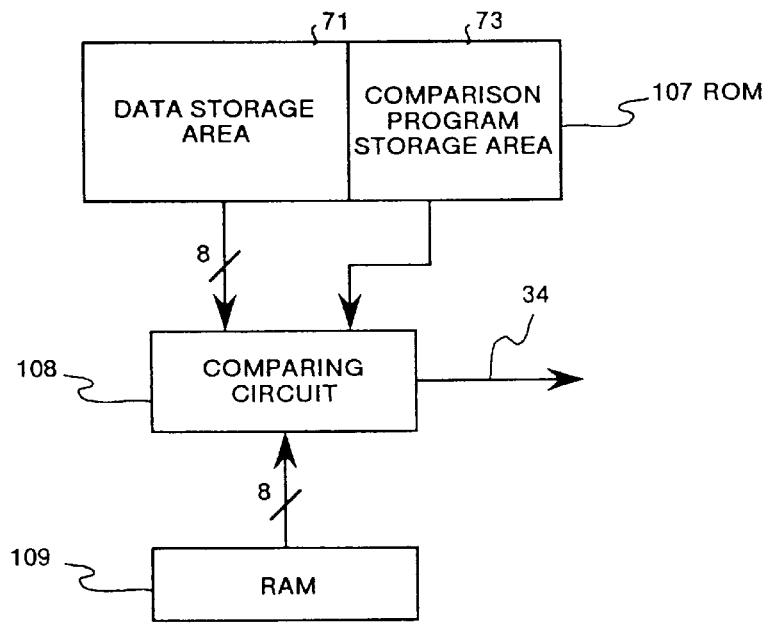
FIG. 5 is a block diagram showing essential sections of a read protect circuit according to Embodiment 5 of the present invention.

FIG. 5 is a block diagram showing essential sections of a read protect circuit according to Embodiment 5 of the present invention. This protect circuit is formed in a chip constituting a microcomputer, and comprises a RAM 109 as a first storage area for storing therein expected value data for all or a portion of the data stored in the internal ROM 107, and a comparing circuit 108 for comparing the ROM data to the expected value data.

The ROM 107 has a data storage area 71 and a comparison program storage area 73. The ROM data is stored in the data storage area 71, and the comparison program executed in the comparing circuit 108 is stored in the comparison program storage area 73 as a second storage area. The comparison program itself is also included in data as an object for comparison to the expected value data by the read protect circuit according to this embodiment.

The comparing circuit 108 compares the ROM data to expected value data corresponding to the ROM data in the ROM data read enabled mode, and outputs a coincidence signal when a result of comparison indicates coincidence between the two types of data, and outputs non-coincidence signal when a result of comparison does not indicates coincidence between the two types of data. On the other hand, in the data read inhibited mode, the comparing circuit 108 does not execute comparison of data, nor outputs a signal indicating coincidence or non-coincidence between the two types of data. The reference numeral 34 in FIG. 5 indicates a coincidence/non-coincidence signal.

Next, description is made for actions in Embodiment 5. Operations of the microcomputer are started in a mode enabling data read from the internal ROM 107, and after the operation mode shifts to the ROM data read enabled mode, when expected value data is written in the RAM 109, the comparing circuit 108 is controlled according to a comparison program stored in the ROM 107, reads out data an expected value data from the ROM 107 and RAM 109 respectively, and compares the data to each other. When comparison for all of the data for comparison is finished, the comparing circuit 108 outputs a coincidence signal or a non-coincidence signal.

With this Embodiment 5, the read protect circuit outputs a coincidence signal or a non-coincidence signal after comparison of all of the data is finished, so that it is difficult for a third person to know an address where data is not coincident, and hence it is possible to prevent illegal reading of ROM data by a third person.

Figure 6:
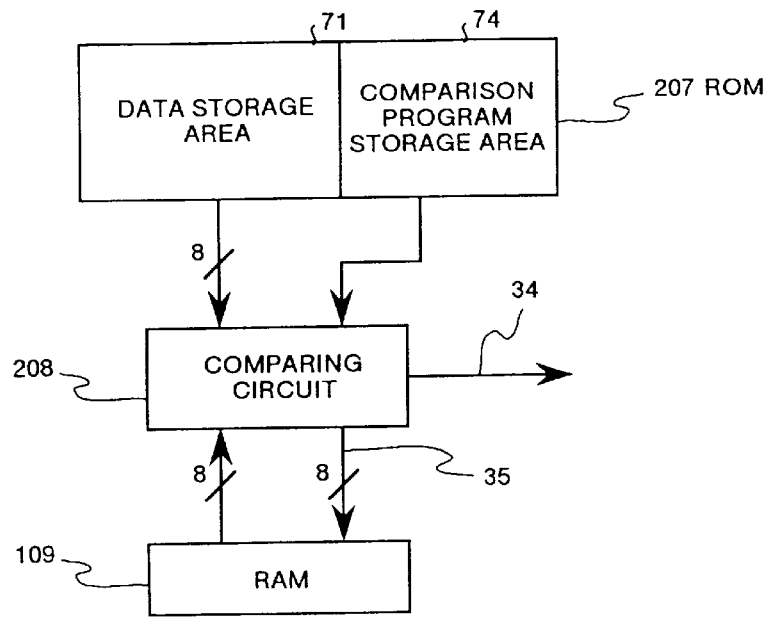
FIG. 6 is a block diagram showing essential sections of a read protect circuit according to Embodiment 6 of the present invention.

FIG. 6 is a block diagram showing essential sections of a read protect circuit according to Embodiment 6 of the present invention. This protect circuit has the functions in Embodiment 4 as well as functions in Embodiment 5, and comprises a ROM 109 as a first storage area for storing therein expected value data corresponding to all or a portion of the data stored in an internal ROM 207, and a comparing circuit 208 for comparing the ROM data to expected value data, and for comparing specified data in the internal ROM 207 with expected data corresponding to the specified data (namely data for comparison).

The ROM 207 has a data storage area 71 with ROM data stored therein and a comparison program storage area 74 as a second storage area. The comparison program storage area 74 stores therein a program executed in the comparing circuit 208 for comparison between the specified data and data for comparison as well as a program executed in the comparing circuit 208 for all of the ROM data to be compared to the expected value data. It should be noted that, the comparison program itself is also included in data as an object for inhibition or permission of data read by the read protect circuit according to this embodiment.

The comparing circuit 208 at first compares the data for comparison to the specified data, and shifts to the ROM data read enabled mode only when a result of comparison indicates coincidence between the two types of data. Then the comparing circuit 208 compares the ROM data to expected value data corresponding to the ROM data, and, after comparison of all of the data is finished, outputs a coincidence signal when a result of comparison indicates coincidence between the two types of data, and a non-coincidence signal when a result of comparison indicates non-coincidence between the two types of data. On the other hand, when a result of comparison indicates non-coincidence between the data for comparison and the specified data, the operation mode is not shifted to the read enabled mode and accordingly comparison between the ROM data and expected value data is not executed. It should be noted that, the reference numeral 34 in FIG. 6 indicates a coincidence/non-coincidence signal, and the reference numeral 35 indicates an address signal for specifying an address at which the data for comparison is stored.

With this Embodiment 6, the read protect circuit shifts to the read enabled mode according to a result of comparison between specified data and data for comparison, and then executes comparison between the ROM data and expected value data, so that a sequence of operations up to data read becomes more complicated, and therefore, it is possible to prevent illegal reading out the ROM data by a third person.

Figure 7:
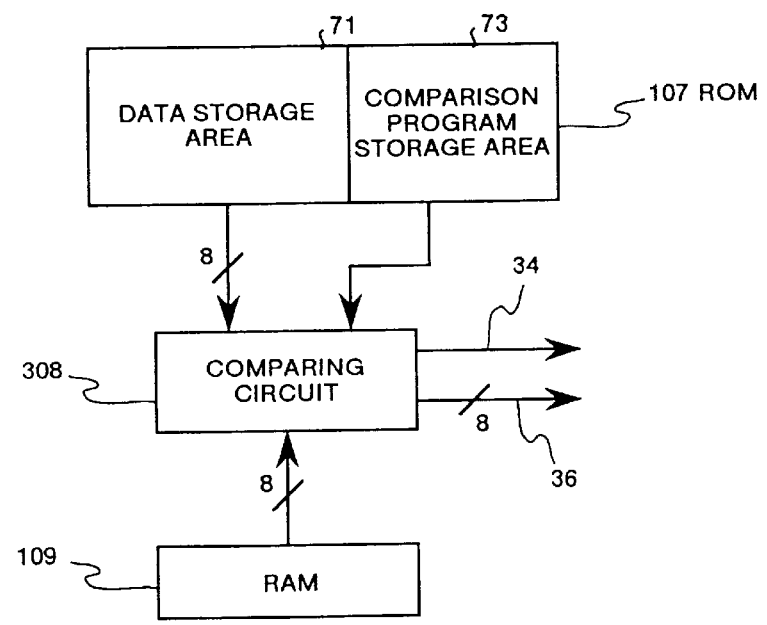
FIG. 7 is a block diagram showing essential sections of a read protect circuit according to Embodiment 7 of the present invention.

FIG. 7 is a block diagram showing essential sections of a read protect circuit according to Embodiment 7 of the present invention. In this protect circuit, a function for outputting addressed of ROM data not coincident to expected value data is added to the functions in Embodiment 5. So in this protect circuit, in place of the comparing circuit 108 for outputting a coincidence/non-coincidence signal 34 in Embodiment 5, a comparing circuit 308 for outputting addresses for ROM data not coincident to expected value data together with a coincidence/no-coincidence signal is used. The reference numeral 36 in FIG. 36 indicates a signal indicating addresses for not-coincident data. The ROM 107 and RAM 109 are the same as those in Embodiment 5, so that description thereof is omitted herein.

With this Embodiment 7, when a result of comparison indicates non-coincidence between the ROM data and expected value data, the read protect circuit outputs addresses for non-coincident data together with a non-coincidence signal, so that it is possible to know a faulty bit and an address of a block including the faulty bit, which makes it possible to easily analyze faulty sections of a ROM.

Figure 8:
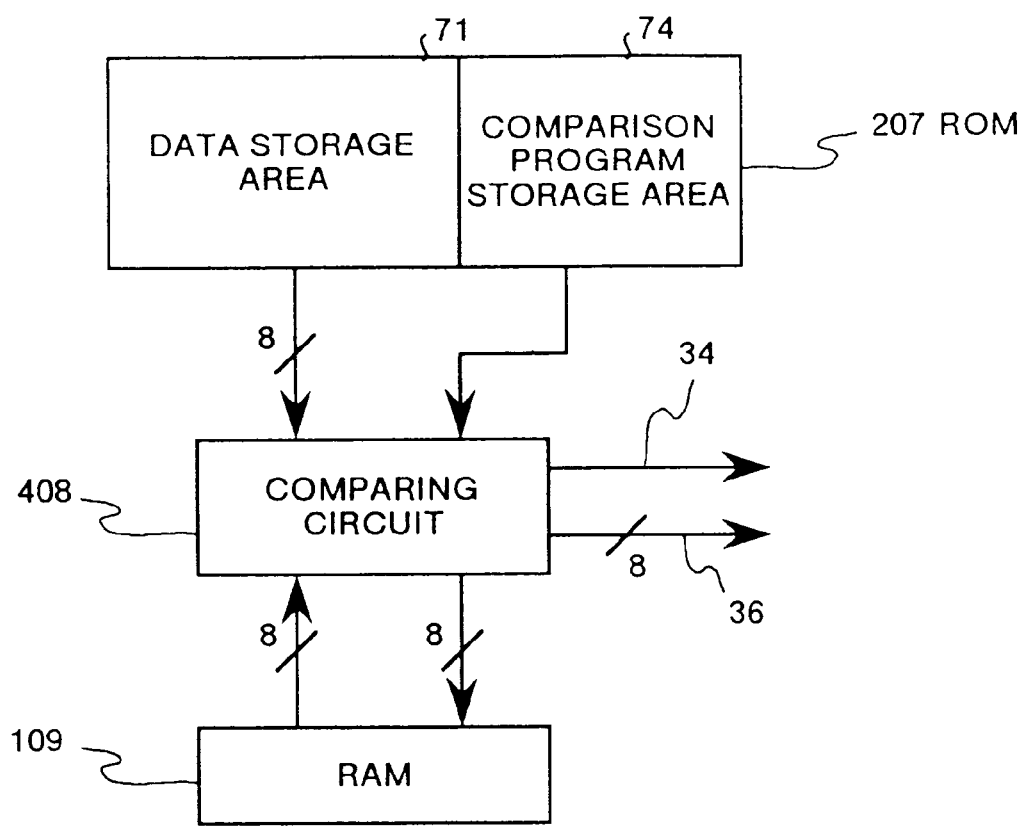
FIG. 8 is a block diagram showing essential sections of a read protect circuit according to Embodiment 8 of the present invention.
Figure 9:
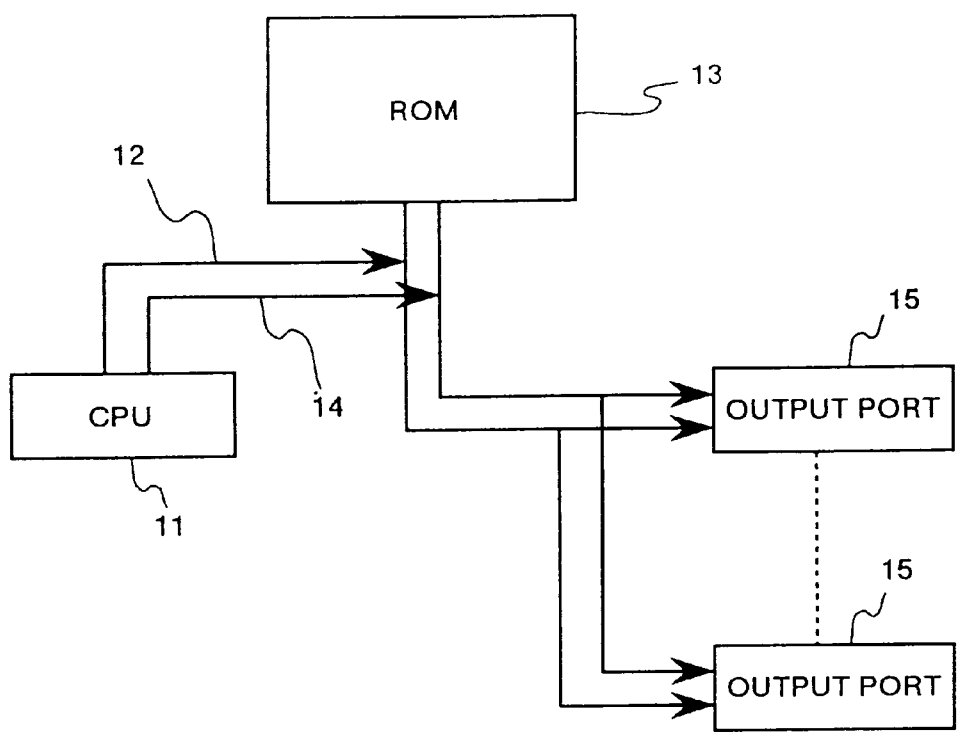
FIG. 9 is a block diagram showing outline of a conventional type of microcomputer.
Figure 10:
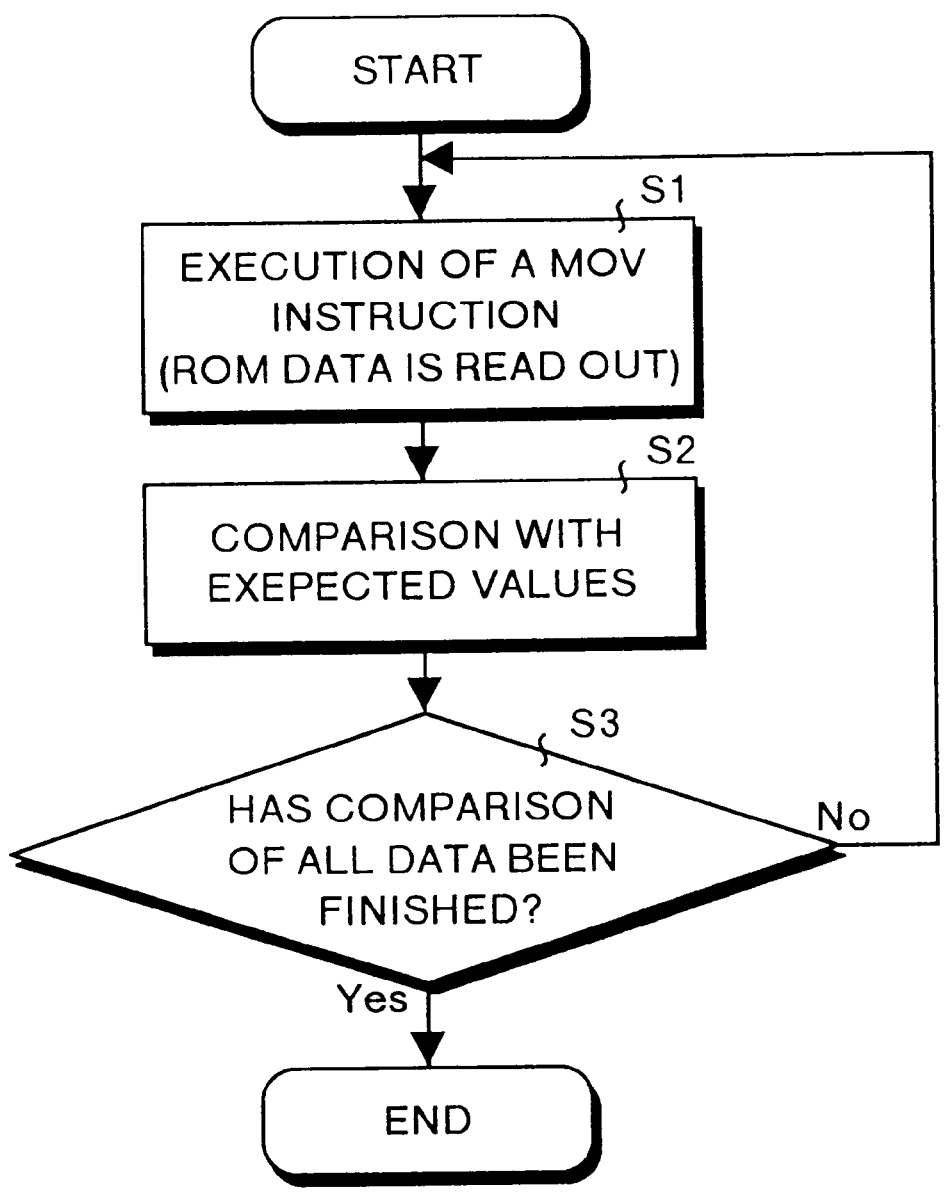
FIG. 10 is a flow chart showing a sequence of operations for checking of the ROM data in the conventional technology.

FIG. 8 is a block diagram showing essential sections of a read protect circuit according to Embodiment 8. In this, protect circuit, a function for outputting addresses for ROM data which are not coincident to the expected value data is added to those in Embodiment 6. Accordingly, a comparing circuit 408 for outputting addresses for ROM data not coincident to the expected value data together with the coincidence/non-coincidence signal 34 in place of the comparing circuit 208 for outputting the coincidence/non-coincidence signal 34 in Embodiment 6. The reference numeral 36 in the figure indicates a signal indicating addresses for non-coincident data. The ROM 207 and RAM 109 are the same as those in Embodiment 6, and description thereof is omitted.

With this Embodiment 8, when a result of comparison between ROM data and expected value data indicates non-coincidence, the read protect circuit outputs addresses of non-coincident blocks together with a non-coincidence signal, so that it is possible to know a faulty bit or an address for a block containing the faulty bit, which makes it possible to easily analyze faulty sections of a ROM.

Various modifications are allowable in the present invention described above. For instance, in Embodiments 1 to 3, the register 4 may be omitted, or discrete memories may be provided for the first storage area 21 and second storage area 22 respectively. Furthermore, in Embodiments 2 and 3, dummy data of "0" (or "1") may be outputted to a plurality of bits decided as not to be outputted in the read inhibited mode. Furthermore, in Embodiments 4 to 8, the comparison program storage areas 72, 73 and 74 maybe provided in memories different from the ROMs 71, 107 and 207.

As described above, with the present invention, the non-volatile memory has a first storage area and a second storage area, the first storage area has at least one rewritable but non-deletable bit and stores therein data capable of inhibiting reading of the ROM in the initial state, while the second storage area has at least one bit non-deletable but rewritable only when specific setting is executed and stores therein ROM data read according to a combination with the data stored in the first storage area, and the logic circuit for control allows or inhibits reading of the ROM according to the contents of the data, so that it is difficult for a third person to effect a mode enabling an operation for reading data from the ROM, and also it is possible to prevent a third person from illegally reading the ROM data.

With the present invention, when reading of the ROM is inhibit, the logic circuit for control inhibits only an operation for reading a portion of bits in each block of ROM data, so that, when a third person tries to read the ROM data, only a portion of the ROM data is read out, and even though the third person thinks that the ROM data is correctly being read out, in reality the ROM data is not correctly being read out, and hence it is possible to prevent illegal reading of the ROM data by a third person.

With the present invention, the second non-volatile memory stores therein data for setting a bit allowing or inhibiting data read for each block of the ROM data, the data is decoded by a decoder with a bit allowing or inhibiting data read for each block of ROM data selected according to contents of the decoded data, so that, even if a third person tries to read out the ROM data, the normal ROM data can not be read out and a sequence of operations for reading out the normal ROM data becomes more complicated, and hence it is possible to prevent illegal reading of the ROM data by a third person.

With the present invention, the first storage area stores therein data used for comparison with the specified data stored at a specified address of the ROM, and the comparing circuit compares the data stored in the first storage area with the specified data stored in the ROM, and outputs a signal allowing reading of the ROM only when the two types of data are identical, so that, only a person knowing contents of the ROM data can correctly input the data for comparison in the first storage area in order to read the ROM data, and hence, it is possible to prevent illegal reading of the ROM data by a third person.

With the present invention, the first storage area stores therein expected value data for all of the data stored in the ROM, the comparing circuit compares all of the expected value data stored in the first storage area with all of the data stored in the ROM, and outputs a non-coincidence signal when the two types of data are not identical after comparison of all of the data is finished, so that it is difficult for a third person to know addresses of the non-coincident data, and hence it is possible to prevent a third person from illegally decrypt and read the ROM data.

With the present invention, the comparing circuit compares the specified data stored at a specified address of the ROM with the expected value data corresponding to expected value data corresponding to the specified data of all of the expected value data stored in the first storage area, and compares all of the expected value data with all of the data stored in the ROM, so that a sequence of operations up to reading of the ROM data becomes more complicated, and hence it is possible to prevent illegal reading of the ROM data by a third person.

With the invention, when a result of comparison between the expected value data stored in the first storage area and all of the ROM data does not indicate coincidence between the two types of data, the comparing circuit also outputs addresses for the non-coincident blocks of ROM data together with a non-coincidence signal, so that it is possible to know an address of a block at which data not coincident to the expected value is stored, and hence it is possible to easily analyze faulty sections of a ROM.

This application is based on Japanese patent application No. HEI 10-318974 filed in the Japanese Patent Office on Nov. 10, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A ROM data read protect circuit comprising:

a non-volatile memory having first and second storage areas, said first storage area having at least one non-deletable and rewritable bit and said second storage area having at least one non-deletable bit which is rewritable only when set in a prespecified state; and a logic circuit for control for controlling enabling or inhibiting of reading of data from a ROM based on the contents stored in said non-volatile memory;

wherein data required for inhibiting the reading of the data from a ROM in the initial state is inputted into said first storage area of said non-volatile memory, and data required for enabling the reading of the data from a ROM in combination with the data stored in said first storage area is inputted into said second storage area of said non-volatile memory.

2. A ROM data read protect circuit according to claim 1; wherein said logic circuit for control inhibits reading of data for at least one bit in each block of the ROM data and at the same time allows reading of data for at least one bit in each block of the ROM data when inhibiting reading of data.

3. A ROM data read protect circuit according to claim 2 further comprising:

a second non-volatile memory storing therein data for setting a bit for inhibiting or enabling reading of data for each block of ROM data; and a decoder for decoding data stored in said second non-volatile memory and selecting a data read inhibiting bit or a data read enabling bit for each block of the ROM data.

4. A ROM data read protect circuit comprising:

a first storage area for storing a data used for comparison with specific data stored in specified addresses of a ROM;

a comparing circuit, coupled to said first storage area, for comparing the data stored in said first storage area to the specific data stored in the ROM and enabling reading of data only when the two data are identical; and a second storage area, coupled to said comparing circuit, for storing a comparison program executed in said comparing circuit.

5. A ROM data read protect circuit comprising:

a first storage area for storing expected value data for all of the data stored in a ROM;

a comparing circuit, coupled to said first storage area, for comparing all of the expected data stored in said first storage area with all of the data stored in the ROM, and when the two data are not identical for outputting a non-coincidence signal after the comparison of all of the data is finished; and a second storage area, coupled to said comparing circuit, for storing a comparison program executed in said comparing circuit.

6. A ROM data read protect circuit according to claim 5; wherein said comparing circuit compares specified data stored at a specified address of the ROM with the expected value data corresponding to the specified data of all of the expected value data stored in said first storage area and when the two data are identical compares all of the expected value data with all of the data stored in the ROM; and said second storage area stores a program for comparing the specified data and the expected value data corresponding to the specified data.

7. A ROM data read protect circuit according to claim 6; wherein said comparing circuit also outputs, when all of the expected value data stored in said first storage area are not identical to all of the data stored in the ROM, addresses of blocks in which the two types of data are not identical to each other, together with said non-coincidence signal.

8. A ROM data read protect circuit according to claim 5; wherein said comparing circuit also outputs, when all of the expected value data stored in said first storage area are not identical to all of the data stored in the ROM, addresses of blocks in which the two types of data are not identical to each other, together with said non-coincidence signal.

9. A ROM data read protect circuit comprising:

a non-volatile memory having first and second storage areas, said first storage area having at least one non-deletable and rewritable bit and said second storage area having at least one non-deletable bit which is rewritable only when set in a prespecified state; and a logic circuit for control for controlling enabling or inhibiting of reading of data from a ROM based on the contents stored in said non-volatile memory;

wherein data required for inhibiting the reading of the data from a ROM is inputted into said first storage area of said non-volatile memory, and data required for enabling the reading of the data from a ROM in combination with the data stored in said first storage are is inputted into said second storage area of said non-volatile memory.

* * * * *